(12) United States Patent
Richard et al.

(10) Patent No.: US 10,135,433 B2
(45) Date of Patent: Nov. 20, 2018

(54) METHOD FOR COMPENSATION OF MANUFACTURING TOLERANCES OF AT LEAST ONE ELECTRIC PARAMETER OF A POWER TRANSISTOR AND ASSOCIATED SYSTEM

(71) Applicant: GE ENERGY POWER CONVERSION TECHNOLOGY LTD., Warwickshire (GB)

(72) Inventors: Stephane Richard, Drancy (FR); Herve Cara, Toussus le Noble (FR); Jean-Marc Nicolai, Courbevoie (FR)

(73) Assignee: GE ENERGY POWER CONVERSION TECHNOLOGY LTD., Warwickshire (GB)

( * ) Notice: Subject to any disclaimer, the term of this patent is extended or adjusted under 35 U.S.C. 154(b) by 643 days.

(21) Appl. No.: 13/834,301

(22) Filed: Mar. 15, 2013

(65) Prior Publication Data

US 2013/0241605 A1 Sep. 19, 2013

(30) Foreign Application Priority Data

Mar. 16, 2012 (FR) ...................................... 12 52392

(51) Int. Cl.
*H03K 17/14* (2006.01)
*H03K 17/10* (2006.01)

(52) U.S. Cl.
CPC ........... *H03K 17/14* (2013.01); *H03K 17/107* (2013.01)

(58) Field of Classification Search
CPC .............................. H03K 17/14; H03K 17/107
See application file for complete search history.

(56) References Cited

U.S. PATENT DOCUMENTS

| | | | | |
|---|---|---|---|---|
| 4,750,217 A | * | 6/1988 | Smith | ...................... H03F 1/226 250/214 A |
| 5,492,842 A | * | 2/1996 | Eytcheson | ............ H02M 7/003 29/593 |
| 6,121,809 A | * | 9/2000 | Ma | .......................... H03F 3/265 327/246 |

(Continued)

FOREIGN PATENT DOCUMENTS

| | | |
|---|---|---|
| DE | 1413526 A1 | 1/1969 |
| EP | 0458511 A2 | 11/1991 |
| WO | 2007122322 A2 | 11/2007 |

OTHER PUBLICATIONS

Fairchild semiconductor,"RC 4190: Micropower switching regulator," 1998, pp. 1-24.*

(Continued)

*Primary Examiner* — Thienvu Tran
*Assistant Examiner* — Pinping Sun
(74) *Attorney, Agent, or Firm* — Wood IP LLC

(57) ABSTRACT

The system (21) includes:
a power transistor (22),
a data medium (60) including data relating to the manufacturing tolerance (Tol) of at least one electric parameter of the transistor (22),
an electric circuit (26) for controlling the transistor adapted so as to operate for a reference value of the parameter ($V_{REF}$),
an electric circuit (64) having an inductance of less than 100 nH and such that the assembly (70) formed with the circuit (64) and the transistor (22) has a value for the parameter, for which the deviation in absolute with the reference value is strictly less than the manufacturing tolerance (Tol).

10 Claims, 6 Drawing Sheets

(56) References Cited

U.S. PATENT DOCUMENTS

| | | | | |
|---|---|---|---|---|
| 6,509,757 | B1* | 1/2003 | Humphrey | H03K 19/00384 326/30 |
| 6,518,833 | B2* | 2/2003 | Narendra | G05F 3/262 323/315 |
| 6,842,710 | B1* | 1/2005 | Gehring | G01R 31/2884 324/601 |
| 6,896,422 | B2* | 5/2005 | Bennett | G02B 6/4224 385/88 |
| 7,170,756 | B2* | 1/2007 | Balakrishnan | H02M 3/00 29/847 |
| 7,667,527 | B2* | 2/2010 | Clark, Jr. | G05F 3/205 327/530 |
| 7,696,811 | B2* | 4/2010 | Barrows | G06F 17/5063 327/534 |
| 7,834,657 | B1* | 11/2010 | Arora | H03K 17/302 326/32 |
| 8,222,954 | B1* | 7/2012 | Ren | H03K 19/00369 323/312 |
| 2003/0034823 | A1* | 2/2003 | Hiraki | G06F 1/26 327/334 |
| 2005/0116765 | A1* | 6/2005 | Sakiyama | H03K 5/133 327/534 |
| 2007/0205802 | A1* | 9/2007 | Perisetty | H01L 27/0921 326/27 |
| 2007/0290704 | A1* | 12/2007 | Shyh | H01L 22/20 324/762.03 |
| 2009/0007029 | A1* | 1/2009 | So | G06F 17/5022 716/132 |
| 2009/0027822 | A1* | 1/2009 | Darwish | H02H 9/025 361/111 |
| 2010/0148847 | A1* | 6/2010 | Schurack | H03K 17/0822 327/396 |
| 2010/0244941 | A1* | 9/2010 | Stuler | H02M 1/34 327/543 |
| 2011/0095811 | A1* | 4/2011 | Chi | H03K 19/00384 327/512 |
| 2011/0140797 | A1* | 6/2011 | Lee | H03B 5/1847 331/167 |
| 2011/0204835 | A1* | 8/2011 | Gollentz | H02M 1/088 318/400.27 |
| 2013/0222075 | A1* | 8/2013 | Reedy | H03M 1/1061 333/32 |

OTHER PUBLICATIONS

Electronic Components,"Understanding the purpose of some electronic components in Electronic circuits," 2010, pp. 1-20.*

EP Search Report dated Jul. 16, 2013, issued in connection with corresponding EP Patent Application No. 13159545.6.

* cited by examiner

METHOD FOR COMPENSATION OF MANUFACTURING TOLERANCES OF AT LEAST ONE ELECTRIC PARAMETER OF A POWER TRANSISTOR AND ASSOCIATED SYSTEM

FIELD OF THE INVENTION

The present invention relates to a method for compensating for manufacturing tolerances of at least one electric parameter of a power transistor as well as to the associated system.

BACKGROUND OF THE INVENTION

AC motors are currently powered from a DC supply bus at the edges of which are connected the different phases of the motors via a frequency converter, consisting of switching units, the state of which is driven by suitable control electronics.

Such control electronics are for example discussed in documents EP-A-0 458 511 and DE-A-141 35 26.

For motors driving pumps or very powerful compressors, notably for the oil industry, very great electric powers may circulate through switching units ensuring the powering of the motor. As an example, voltages comprised between 1,000 and 4,000 volts may be applied on the switching units.

The switching units are formed with transistors of the insulated gate bipolar type. The insulated gate bipolar transistor, with the acronym of IGBT, is a semi-conductor device from the family of transistors, which is used as an electronic switch, mainly in power electronic circuits. This component, which combines the advantages of great simplicity for controlling the field effect transistor as compared with the bipolar transistor while retaining the low losses by combustion of the latter, has allowed much progress in power electronics both as regards liability and the economic aspect. Nevertheless, in order to make frequency converters for very powerful motors, a plurality of transistors of the IGBT transistor type should be mounted in series for ensuring each switching, a single transistor not giving the possibility of interrupting circulation of the current for very high voltages on its terminals.

The plurality of transistors, thereby connected in series, should be controlled with perfect synchronization so that the transistors functionally correspond to a single transistor. Synchronization errors between the different transistors lead to the fact that the voltage is supported by only one of the transistors, which may cause its destruction.

Taking into account the manufacturing tolerances of the transistors and the accuracy of the control electronics, synchronization of the operation of the transistors is delicate to ensure. Highly sophisticated control electronic solutions have thus been developed. Such solutions involve the application of specific integrated circuits which are very expensive.

A technique for protecting the transistors, currently designated by the expression «active clamping» is also known. According to this solution, the transistors are associated between the control gate and a conducting terminal with a Zener diode with a resistance which, when the voltage is too strong between the conducting terminals of the transistor, gives the possibility of bringing the transistor back to its conducting state and thereby limiting the voltage on its terminals.

This technique imposes very high margins for igniting the transistors and imposes the use of resistant and relatively accurate Zener diodes.

Document WO-A-2007/122 322 also describes a method for balancing the voltages of two IGBT transistors placed in series using a so-called «active sharing» method (master/slave notion).

These different solutions prove to be suitable for a limited number of IGBT transistors, such as two or three. However, when a large number of IGBT transistors is considered for putting them in series, notably four of them, these solutions are no longer suitable, notably because the proposed adjustment is dependent both on the transistor and on the relevant control circuit. In the case of a replacement following malfunction of one of the two elements, it is the whole of the adjustment which has to be taken up again.

Therefore, there exists a need for a circuit giving the possibility of facilitating maintenance of the systems in which power transistors, in particular IGBT transistors, are triggered simultaneously, notably in a series configuration.

SUMMARY OF THE INVENTION

For this, a system is proposed, including a power transistor, a data medium comprising data relating to the manufacturing tolerance of at least one electric parameter of the transistor and a transistor control electric circuit adapted for operating for a reference value of the parameter. The system includes an electric circuit having an inductance of less than 100 nH and such that the assembly formed by the circuit and the transistor has a value for the parameter, for which the deviation in absolute value with the reference value is strictly less than the manufacturing tolerance.

A device is also proposed, including a first power transistor obtained by a manufacturing process and having a first value for an electric parameter of the transistor and a second power transistor obtained by the same manufacturing process having a second value for the parameter, the second value being different from the first value. The device also includes a first circuit so that the first assembly formed by the first circuit and the first transistor has a third value for the parameter and a second circuit such that the second assembly formed by the second circuit and the second transistor has a fourth value for the parameter, the deviation in absolute value between the third and the fourth value being strictly less than the deviation in absolute value between the first and the second value.

According to particular embodiments, the system or device comprises one or more of the following characteristics, taken individually or according to all technically possible combinations:
  the data medium is a specification sheet of the transistor.
  the electric parameter relates to the switching of the transistor.
  the electric parameter is one of the following parameters: the Miller capacitance, the threshold voltage of the transistor, the delay time of the transistor and the rising time of the transistor.
  the electric circuit(s) has(have) an inductance of less than 75 nH.
  the electric circuit(s) include(s) passive components.
  the electric circuit(s) include(s) active components.
  the electric circuit(s) has(have) a flexible circuit.
  the electric circuit(s) and the control circuits coincide.
  the system or device is intended for simultaneously triggering power transistors.

An assembly is also proposed including several systems as described earlier, the electric control circuits being the same for each transistor of the systems.

The invention also relates to an electric power supply including the assembly described earlier.

A method for compensation of manufacturing tolerances of at least one electric parameter of a power transistor is also proposed, the method including the steps for providing a power transistor and providing data relating to the manufacturing tolerance of one or more electric parameters of the transistor. The method includes a step for providing a reference value for the parameter and for providing an electric circuit having an inductance of less than 100 nH and such that the assembly formed by the circuit and the transistor has a value for the parameter, for which the deviation in absolute value with the reference value is strictly less than the manufacturing tolerance.

In other words, the invention relates to a device including a first power transistor obtained by a manufacturing process and having a first value for an electric parameter of the transistor, a second power transistor obtained by the same manufacturing process having a second value for the parameter, the second value being different from the first value, a first electric circuit such that the first assembly formed with the first electric circuit and the first transistor has a third value for the parameter, and a second electric circuit such that the second assembly formed with the second electric circuit and the second transistor has a fourth value for the parameter. The deviation in absolute value between the third value and the fourth value is strictly less than the deviation in absolute value between the first value and the second value. The first electric circuit has an inductance of less than 100 nH, is a flexible circuit, and includes passive or active components. The second electric circuit has an inductance of less than 100 nH, is a flexible circuit, and includes passive or active components.

According to particular embodiments, the device comprises one or more of the following features, taken individually or according to all technically possible combinations:
  the electric parameter relates to the switching of the transistors.
  the electric parameter is one of the following parameters: the Miller capacitance, the threshold value of the transistors, the delay time of the transistors and the rising time of the transistors.
  at least one of the first electric circuit or of the second electric circuit has an inductance of less than 75 nH.

The invention also relates to a system including a power transistor, a data medium comprising data relating to the manufacturing tolerance of at least one electric parameter of the transistor, and an electric circuit for controlling the transistor adapted so as to operate for a reference value of the parameter. The system further includes an electric circuit having an inductance of less than 100 nH, being a flexible circuit, including passive or active components, and such that the assembly formed with the electric circuit and the transistor has a value for the electric parameter, for which the deviation in absolute value with the reference value is strictly less than the manufacturing tolerance.

According to the particular embodiments, the system comprises one or more of the following features, taken individually or according to all technically possible combinations:
  the data medium is a specification sheet of the transistor.
  the electric circuit and the electric control circuit coincide.
  the electric parameter relates to the switching of the transistor.
  the electric parameter is one of the following parameters: the Miller capacity, the threshold voltage of the transistor, the delay time of the transistor and the rising time of the transistor.
  the electric circuit has an inductance of less than 75 nH.
  the system being intended for simultaneously triggering of power transistors.

An assembly is also proposed, including several systems as described earlier. The electric control circuits are the same for each transistor of the system.

The invention also relates to the electric power supply including the assembly as described earlier.

A method is also proposed for compensation of manufacturing tolerances of at least one electric parameter of a power transistor, the method including the steps for providing a power transistor, providing data relating to the manufacturing tolerance of at least one electric parameter of the transistor, providing a reference value for the electric parameter and providing an electric circuit having an inductance of less than 100 nH, the electric circuit being a flexible circuit, including passive or active components, and such that the assembly formed with the electric circuit and the transistor has a value for the parameter, for which the deviation in absolute value with the reference value is strictly less than the manufacturing tolerance.

BRIEF DESCRIPTION OF THE DRAWINGS

Other features and advantages of the invention will become apparent upon reading the detailed description which follows, of embodiments of the invention, given only as an example and with reference to the drawings which show.

DETAILED DESCRIPTION OF THE PREFERRED EMBODIMENTS

Figure 1:
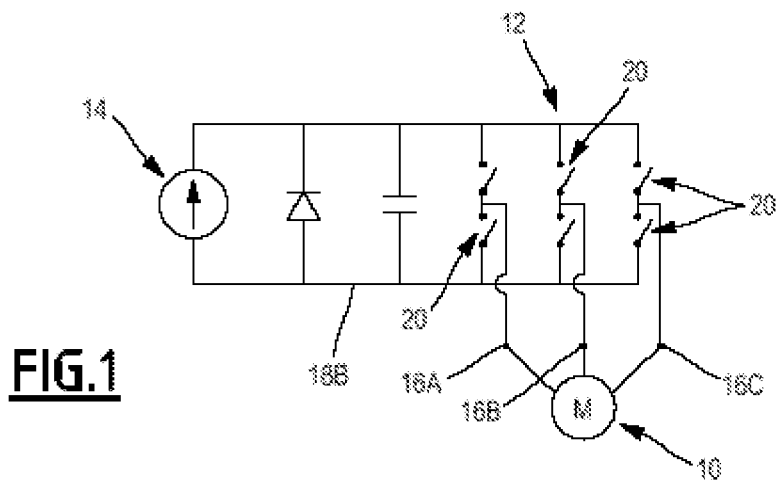
FIG. 1, a schematic view of a variable speed drive powering an AC motor.

In FIG. 1, an AC motor 10 is powered by a DC voltage power supply 12 as illustrated. This converter is connected on a DC power supply bus 14. For example, three poles 16a, 16b, 16c of the motor are each connected to a terminal 18a, 18b of the DC power supply bus through a switching circuit 20. Thus six switching circuits 20 are implemented, each between one phase of the motor and one terminal of the bus. Each switching circuit 20 is driven by a control circuit not shown.

Figure 2:
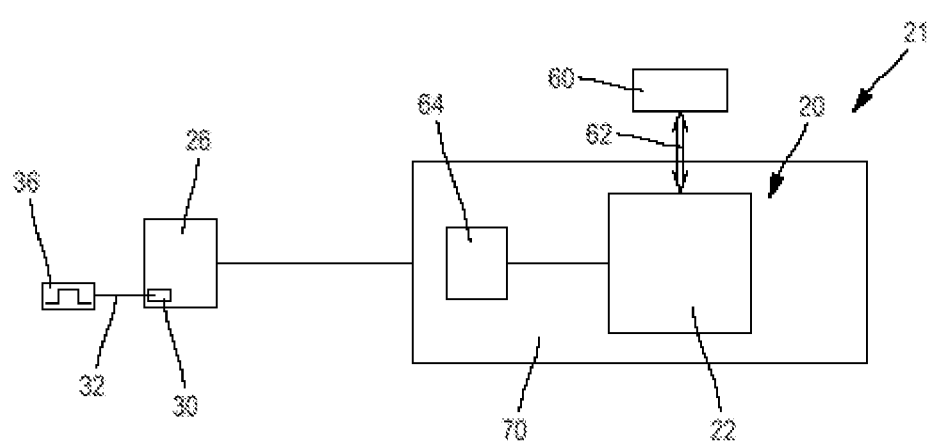
FIG. 2, a schematic view of an exemplary assembly of a control circuit and switching circuit according to the invention.
Figure 3:
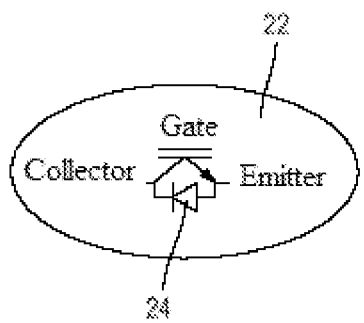
FIG. 3, a detail of FIG. 2.

FIG. 2 is a schematic view of a system 21 including a control circuit assembly with a switching circuit according to the invention. The switching circuit 20 in FIG. 2 includes a power transistor 22. In the case of this example, the transistor 22 is of the IGBT type. This transistor 22 is illustrated in more detail in the schematic view of FIG. 3. In a way known per se, the transistor 22 includes a collector, a gate and an emitter. Further, between the connector and the emitter of the transistor 22 is found a diode 24 wired backwards. This IGBT transistor 22 is connected to the control circuit 26 (sometimes called a driver). The control circuit 26 includes several elements: it notably comprises an optical receiver 30. This receiver 30 receives an optical signal transmitted through an optical fiber 32, which is representative of a control signal. In this example, the control signal is transmitted by a generator 36 transmitting square waves with a square voltage having an amplitude comprised between 0 and 5 volts. Such a generator 36 is actually a customary generator which is easy to use. The optical fiber 32 thus gives the possibility of insulating the high voltage portion from the low voltage portion and insulating the different elements from each other. The system 21 also includes a data medium 60 comprising data relating to the manufacturing tolerance of at least one electric parameter of the transistor 22. Schematically, the interaction existing between the data medium 60 and the transistor 22 is illustrated by a double arrow 62 in FIG. 2. According to the embodiments, the data medium 60 is different. As an example, the data medium 60 is a simple sheet which is provided by the supplier of the power transistor 22. In another case, the database of the supplier is the data medium 60, which means that the data medium 60 is a virtual database accessible via Internet. Alternatively, the data medium 60 is the envelope of a power transistor 22 on which the manufacturing tolerances are written. Other means giving access to the manufacturing tolerance for the relevant power transistor 22 may be contemplated for the data medium 60.

The data themselves have different forms and appear in different ways depending on the cases. Thus, when the data relate to a tolerance interval, this interval is expressed differently depending on the cases. As an example if the quantity G is considered, the tolerance interval is expressed in the form of more or less 4% or further in the form of $G_{min}$ to $G_{max}$. Further, depending on the embodiments, the data also include a typical value of G.

Figure 4:
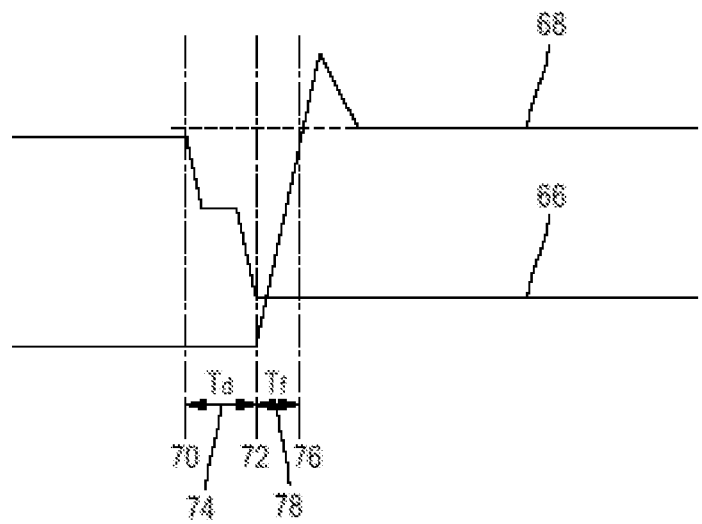
FIG. 4, a graph illustrating the electric switching.

The electric parameters of the relevant transistor 22 are different depending on the alternatives. As an example, the gate control voltage generally noted as $U_{GE}$ or further the collector/emitter voltage may be considered. Preferentially within the scope of this invention, the relevant electric parameters relate to switching. They directly have an influence on the switching, whether this is on the delay time or on the actual switching rapidity. The delay time and the rapidity of the switching are two physical phenomena which characterize the switching of a switching circuit. With the graph of FIG. 4, it is possible to understand the difference between both of these phenomena. In this FIG. 4, two curves, curve 66 are illustrated, corresponding to the gate control voltage of the transistor 22 and curve 68 corresponding to the collector/emitter voltage of the transistor 22. It is observed that for a set value of the square wave type given at instant 70, materialized by the vertical dashed line, the transistor 22 does not immediately react, by referring to the gate control voltage. There is a delay up to instant 72 illustrated by the vertical dashed line. In FIG. 4, this delay is materialized by the double arrow 74 between both vertical lines 70 and 72. During this delay, no voltage is measured between the collector and the emitter. The associated characteristic time is $T_D$. According to the example of FIG. 4, it corresponds to the elapsed time between the instants 72 and 70. On the other hand, in the interval between the vertically marked instants 72 and 76, the voltage measured between the collector and the emitter gradually increases until it attains a voltage value corresponding to its value in a stabilized steady state. A time $T_F$ thus appears, which corresponds to the specific rising time of the transistor 22. The time $T_F$ corresponds to the time elapsed between the instants 72 and 76. This is indicated by the double arrow 78. The switching of the transistor 22 is therefore characterized by the parameters $T_D$ and $T_F$.

Any electric parameter giving the possibility of changing or controlling these times $T_D$ and $T_F$ is preferentially considered here. The modification of these times may notably be made by adjusting the control of the transistor (22) by adapting a resistance value, by varying the current from a current regulator or further by integrating a delay to the control.

The system 21 of FIG. 2 also includes a control circuit 26 of the transistor 22 which is adapted for operating for a reference value of the selected parameter.

An electric circuit 64 is also part of the system 21. This electric circuit 64 is designed in such a way that the assembly 70 formed with the circuit 64 and the transistor 22 has a value for the relevant parameter, for which the deviation in absolute value with the reference value is strictly less than the manufacturing tolerance. Mathematically, this means that $|V-V_{REF}|<Tol$.

Wherein

V is the value of the parameter for the assembly 70 of the circuit 64 and of the transistor 22, $V_{REF}$ is the reference value of the parameter and Tol is the value of the manufacturing tolerance.

The electric circuit 64 has a controlled inductance. This means that its inductance is less than that of an electric wire which would connect the transistor 22 to the control device 26. Thus, the inductance of the electric circuit 64 is less than 100 nH, preferentially 75 nH.

Figure 5:
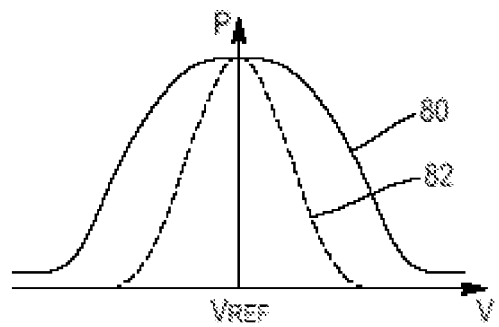
FIG. 5, a graph illustrating an advantage of the system of FIG. 2.

The benefit of this circuit 21 is schematically illustrated by FIG. 5. In this FIG. 10, two Gaussian curves are schematized, the Gaussian curve 80 and the Gaussian curve 82 are representative of the probability of finding a transistor 22, respectively an assembly 70, having a given value V. The half-height width of the Gaussian 80 is less than the half-height width of the Gaussian 82. The transistor 22 has manufacturing tolerances corresponding to the width at half-height of the curve 80. The benefit of the circuit 64 is to reduce the widening of this Gaussian curve 80, which ensures that virtually the assembly 70 is like a transistor 22 for which the manufacturing tolerances are smaller. In other words, the assembly 70 is a transistor 22 with a reduced dispersion of the switching parameters. The circuit 64 thus plays the role of a circuit reducing the manufacturing dispersion of the switching characteristics of the component 22.

Figure 6:
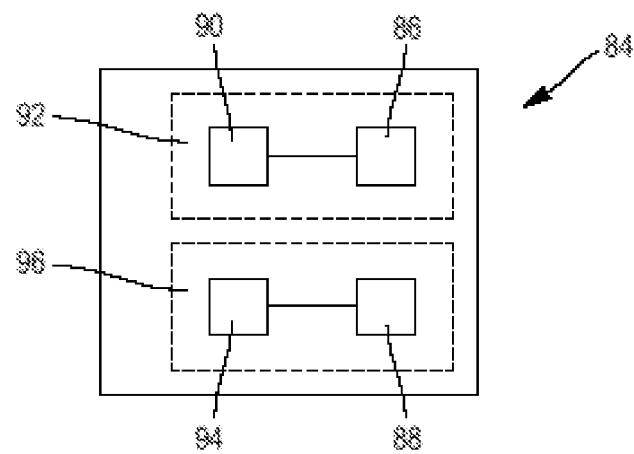
FIG. 6, a schematic view of an exemplary device according to the invention.

An alternative and equivalent way of designing this invention is to consider the device 84 schematized in FIG. 6. The device 84 includes a first power transistor 86. This transistor 86 is an IGBT transistor obtained by a manufacturing process. It has a first value V1 for a given electric parameter. This electric parameter preferentially relates to switching as described earlier. Subsequently, this parameter is noted as P. The device 84 also includes a second transistor 88. This second power transistor 88 is also an IGBT transistor which was obtained by the same manufacturing process as the first power transistor 86. This means that there exist manufacturing tolerances for the parameter P between both transistors 86 and 88. This second transistor 88 has a second value V2 for the parameter P. The second value V2 is different from the first value V1. In the most extreme case, the difference between V2 and V1 corresponds to the manufacturing tolerance.

The device 84 also includes a first electric circuit 90 such that the first assembly 92 formed with the first circuit 86 and the first transistor 90 has a third value V3 for the parameter P. The first assembly 92 is formed by connecting the first circuit 90 and the first transistor 86. The device 84 further includes a second electric circuit 94 such that the second assembly 96 formed with the second circuit 94 and the second transistor 88 has a fourth value V4 for the parameter P. The deviation in absolute value between the third value V3 and the fourth value V4 is strictly less than the deviation in absolute value between the first value V1 and the second value V2. This is mathematically expressed by the inequality:

$$|V3-V4|<|V1-V2|.$$

Each of the electric circuits 90 and 94 has a controlled inductance. The electric circuit 90, respectively the electric circuit 94, has a controlled inductance. This means that its inductance is less than that of an electric wire which would connect the transistor 22 to the control device 26. Thus, the inductance of the electric circuit 90, respectively the electric circuit 94, is less than 100 nH (nanoHenry) preferentially 75 nH.

Here again, the advantage of reducing the manufacturing tolerances is ensured by adding the electric circuits 90 and 94.

Figure 7:
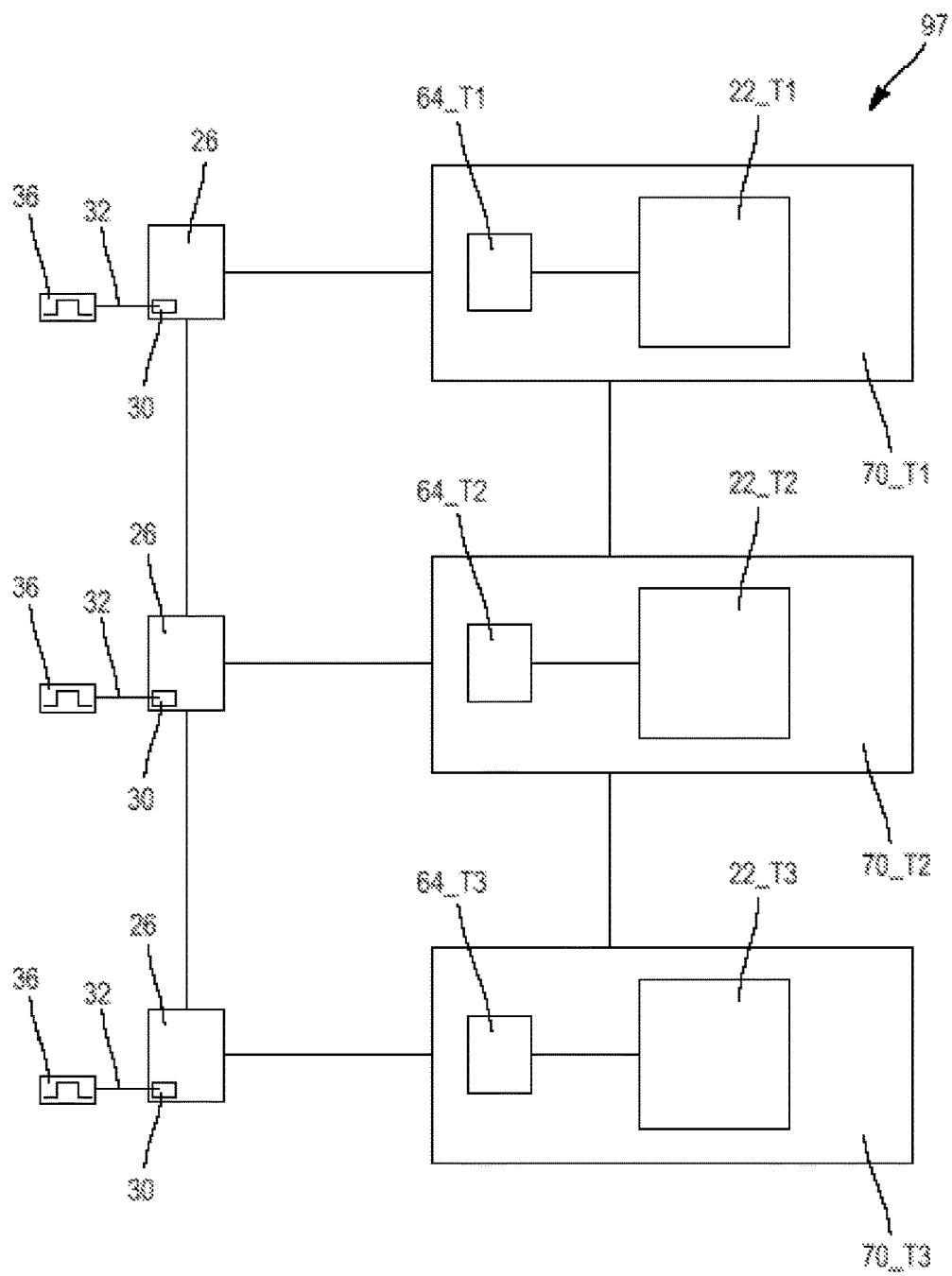
FIG. 7, a schematic view of an exemplary assembly according to the invention.

By obtaining reduced dispersions for the switching parameters of the switching circuit, it is possible to use a control circuit 26 which would be a standard circuit. This is illustrated in FIG. 7 which shows an assembly 97 with three transistors, T1, T2 and T3 which are controlled by an identical control circuit 26. In order to illustrate this, the choice was made of using the same reference signs as in FIG. 2 by adding as a suffix an indication -Ti in order to show that this is the dedicated element for transistor Ti. Thus, the circuits 64-T1, 64-T2 and 64-T3 are specific to the relevant transistor while the control circuits 26 are the same regardless of the relevant assembly 70-Ti. In addition to the advantage implying that customized control circuits 26 do not have to be manufactured, the use of the assembly 97 especially gives the possibility of facilitating maintenance of the systems including IGBT transistors. Indeed, in the case of a failure of a faulty element, this may be the actual IGBT transistor or the control circuit, the replacement of the faulty element does not involve any new tests for pairing up again the assembly of the switching circuit and of the control circuit.

We shall now illustrate a few different embodiments of this idea while demonstrating the advantages associated with them. This will lead us to describing more specifically the elements which are contained in the circuit 64 of FIG. 2.

Figure 8:
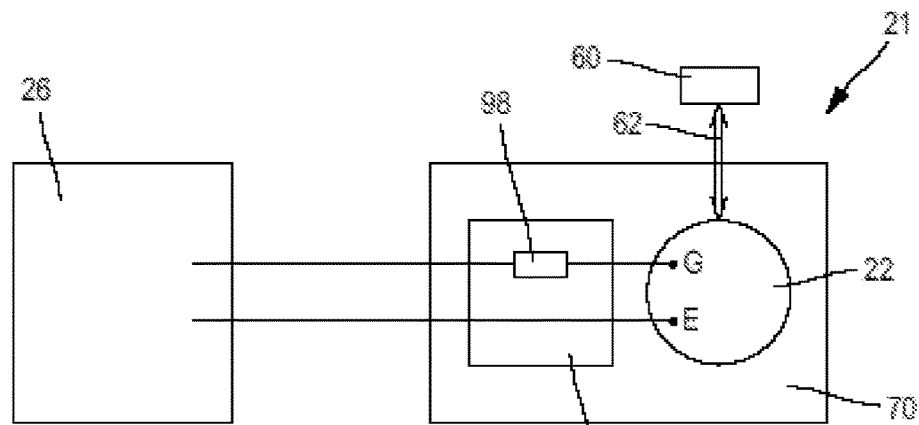
FIGS. 8 to 14, schematic views of exemplary systems according to the invention, and FIG. 15, a flow chart of an exemplary compensation method.

As a first exemplary embodiment, the embodiment of FIG. 8 may be considered. The same reference signs as those of FIG. 2, when this is relevant, are repeated. According to the example of FIG. 8, the circuit 64 includes passive elements. The passive element is a through-resistor 98 in this case. The use of a resistor has the advantage of being particularly simple to apply.

Figure 9:
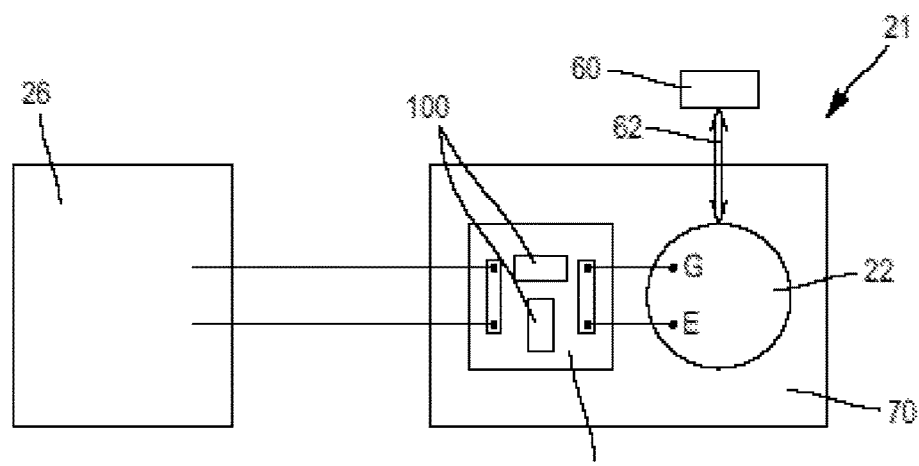

FIG. 9 illustrates another example of a system 21 with a different electric circuit 64. In this case, the electric circuit 64 is a rigid printed circuit on which components 100 are soldered. The components 100 are, as also for the case of FIG. 8, passive elements such as a resistor or are active elements. As an example of active elements, a current source for which the current is different depending on the characteristics of the IGBT transistor 22 in order to always obtain the same values for the sum of the time intervals $T_D$ and $T_F$ may be contemplated. In both cases which have just been described, i.e. those of FIGS. 8 and 9, both assemblies 70 have the advantages described earlier.

Figure 10:
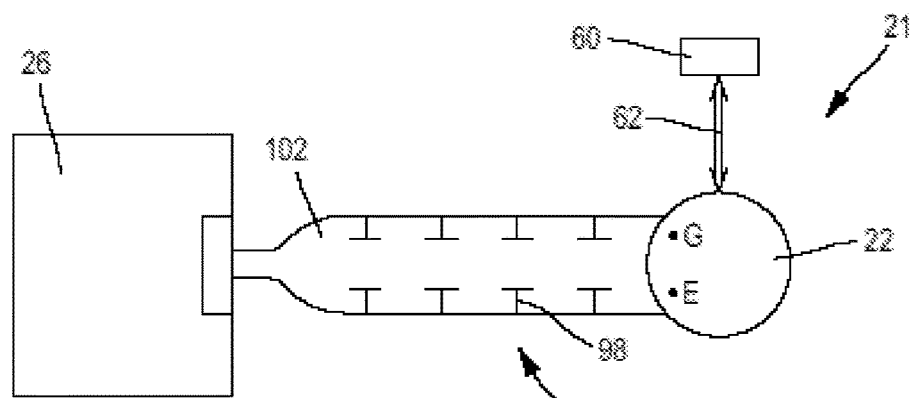

FIG. 10 illustrates another particularly advantageous embodiment. According to this embodiment, the circuit 64 is a flexible circuit 102 having the advantage of having a lower inductance than that of a cable and being reproducible. Depending on the case, the flexible circuit 102 integrates components ensuring the adjustment. The components are either passive or active. As an example, the contemplated components 98 are the same as the components 98 described with reference to FIG. 8. According to an embodiment, the connection through a flexible circuit 102 supports connections allowing a small size printed circuit to be supported. Preferably, these connections are standardized connections.

Figure 11:
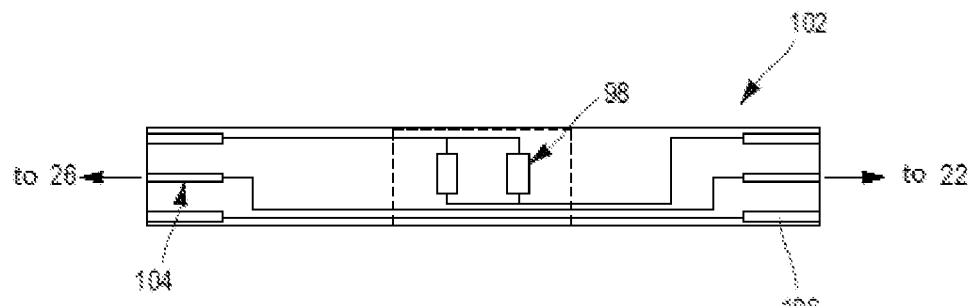
Figure 12:
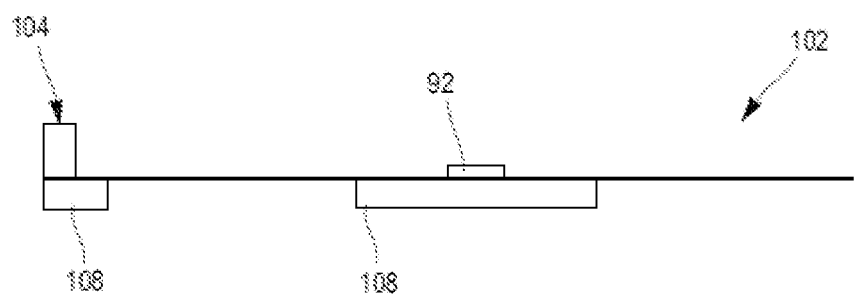

The benefit of using a flexible circuit 102 is a geometrical advantage. Indeed, a flexible circuit is deformable unlike a rigid printed circuit like in the case of FIG. 9. In the case of power transistors like IGBT transistors, many mechanical stresses are imposed on the connections. Consequently, benefiting from a connection with increased flexibility is particularly favorable. Indeed, a flexible circuit 102 may be deformed at will, with which it is possible to contemplate three-dimensional configurations which would be very difficult to make with a rigid printed circuit. Furthermore, this configuration may be modified according to the desires of the user. FIGS. 11 and 12 illustrate the flexible connection circuit 102. According to FIG. 11, the flexible circuit 102 is seen from above. On the left, connections 104 to the control circuit 26 are illustrated. The connections 104 are for example surface-mounted connectors (SMCs) or copper pads. The flexible circuit 102 also includes components 98 in its center. The flexible circuit 104 also includes connections 106 to the IGBT transistor 22. These connections 106 are three in number for the three channels of the IGBT transistor 22, i.e. the collector, the gate and the emitter. The connections 100, as an example, are copper pads or a contact to be soldered. FIG. 12 is a schematic side view of the flexible circuit 102. The components 98 and the connectors 104 are common with FIG. 11. The supports 108 which allow the flexible circuit 104 to be stiffened in the areas supporting the components are further illustrated. These supports are for example in materials of the FR4 type in a CEM1 material, in aluminum or other material. The materials of the FR4 (acronym: Flame Resistant 4) type are epoxy resin composites reinforced with glass fiber while the materials of the type CEM1 are epoxy resin composite materials with glass fiber and a paper core.

Figure 13:
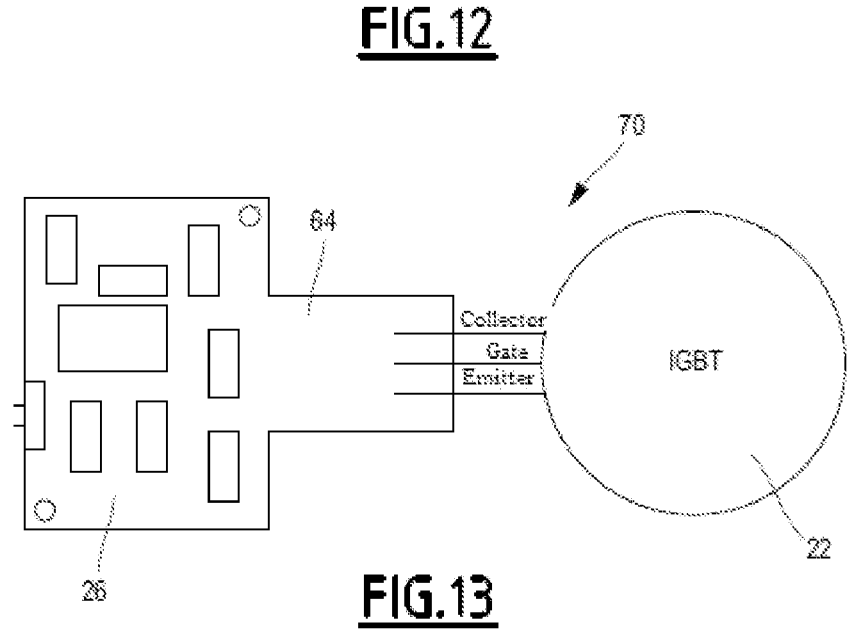

According to another embodiment illustrated by FIG. 13, the electric circuit 64 and the control circuit 26 coincide. This allows total integration of the control circuits with the IGBT transistor 22, the assembly 70 is then directly connectable to the power supply source. The result of this is easier handling of the IGBT transistors 22. The electric circuit 64 will thus be directly adjusted to the IGBT transistor 22. This is implemented for example by means of an external series connection for adjusting the control of the IGBT transistor 22 according to FIG. 13.

Figure 14:
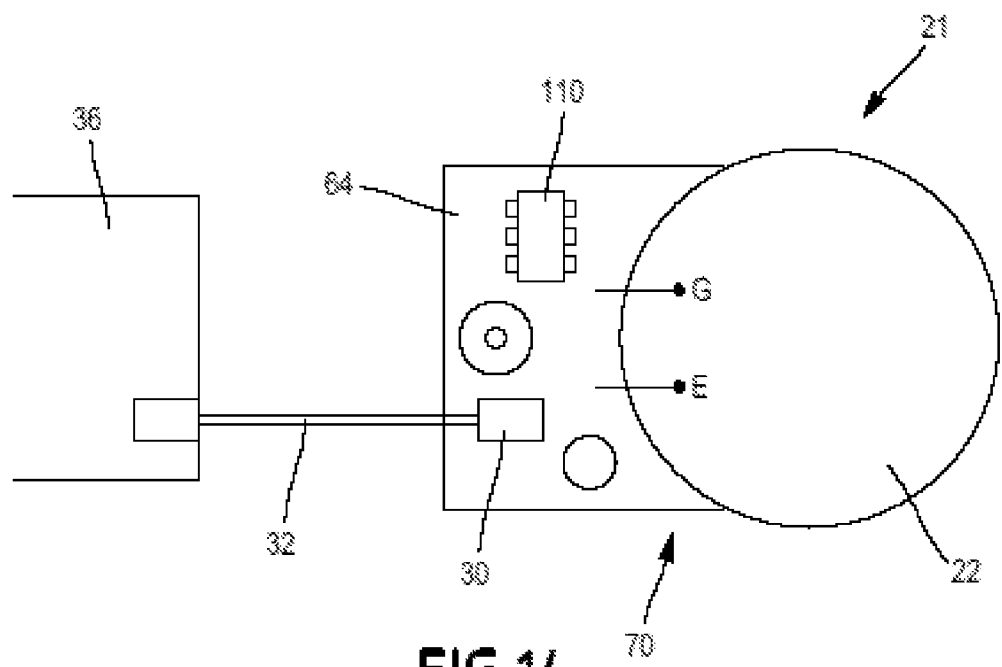

FIG. 14 shows another exemplary embodiment of a control circuit integrated with the transistor IGBT 22. In this case, a specific integrated circuit called an ASIC is contemplated. An ASIC (acronym of Application-Specific Integrated Circuit) is a specialized integrated circuit generally grouping a large number of single and/or tailored functionalities. The benefit of integration is to reduce the production costs and to increase the reliability while allowing substantial integration. Today, a digital electronic circuit is developed by using a description language (of the VHDL type) which is compiled by logic synthesis in order to produce the drawing of the circuit automatically. The same description languages are used for making prototypes and pre-series with programmable logic components or FPGAs. Due to the high initial costs, the production of ASICs is nevertheless generally reserved for large volumes. In the present case, these ASICs 110 will be such that they will allow artificial adjustment of the time interval $T_D$ from counters for reducing or increasing the value of the time interval $T_D$ in order to guarantee that the total value of the sum of the time intervals $T_D$ and $T_F$ is always the same over time.

Preferentially, such an integrated control circuit 64 has a connection 32 to the control 36 in order to pass on different information and also allowing adjustment of the value of the time $T_D$.

Therefore, systems 21 have been described with an electric circuit 64 allowing reduction in the perceived manufacturing tolerances when the assembly 70 formed with the circuit 64 itself with the transistor 22 is considered. In the end, this gives the possibility of contemplating the production of a standardized assembly 70 formed with an electric circuit 64 and the associated IGBT transistor 22. This should also give the possibility of contemplating the making of connections in series of a potentially illimited number of IGBT transistors. Indeed, with a standardized component, synchronization is greatly facilitated.

According to the invention, a method is also proposed with which the characteristics of the electric circuit may be selected so that the formed assembly 70 has the intended characteristics.

Figure 15:
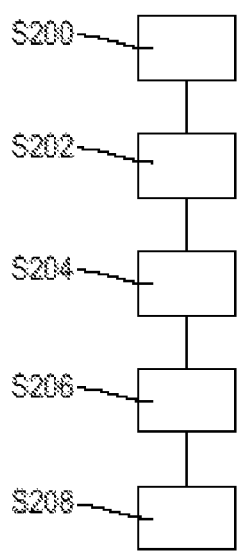

This method is illustrated by the flow chart of FIG. 15. This method is a method for compensation of manufacturing tolerances Tol_i of at least one electric parameter of the power transistor 22. This method includes a step S200 for providing a power transistor 22. This transistor is preferentially a transistor of the IGBT type 22. This method also includes a step S202 for providing data relating to the manufacturing tolerance Tol of at least one electric parameter of the transistor 22. Depending on the cases, the data are provided in different ways: by accessing an Internet database of the manufacturer, by providing a simple sheet of paper giving the indications or any other means.

The method also includes a step S204 for providing a reference value $V_{REF}$ for the parameter. This provision step S204 is for example accomplished by providing a control circuit 26 giving through its characteristics the reference value $V_{REF}$. Indeed, the reference value $V_{REF}$ will correspond to the value for which the control circuit 26 is adapted in order to operate. This value $V_{REF}$ is indicated on the circuit itself or is provided by means of a database or a specifications sheet given by the manufacturer.

The method also includes a step S206 for selecting the characteristics of the electric circuit 70 such that the assembly 70 formed by the circuit 64 and the transistor 22 has a value for the parameter, for which the deviation in absolute value with the reference value is strictly less than the manufacturing tolerance. Formulated otherwise, Tol_i which is the target tolerance, is less than the initial tolerance noted as Tol. The electric circuit 70 further has a controlled inductance, i.e. an inductance of less than 100 nH, preferentially less than 75 nH.

At this step S206, the different structures shown earlier with reference to FIGS. 8 to 14 may be contemplated and the parameters of the different elements of these circuits will be the characteristics which will be sought. As an example, we shall consider the case of FIG. 8 where the component 98 is simply a resistor. In this case, the only characteristic to be known is the value of the resistance and the inductance of the circuit 64.

The method then includes an adjustment step S108. This adjustment is applied in different ways depending on the relevant alternatives. This adjustment of the value of the resistance is made by suppressing the electric connection ensuring the putting of several resistors in parallel. This adjustment has the advantage of being easy to apply, but nevertheless it only allows one adjustment with discrete values. Making a better adjustment by means of a laser may be contemplated. The laser is then intended to produce an insolation of a portion of the resistor which allows the resistance to be varied. This technique is called a «laser trim».

With reference to FIG. 15, a method for manufacturing tolerance compensation of at least one electric parameter of a power transistor has thus been described, giving the possibility of obtaining an assembly 70 formed with an electric circuit 64 and the transistor 22 having the characteristics sought within the scope of the invention. As this method is easy to apply, it should give the possibility of greatly facilitating the final putting into series of the IGBT transistors 22.

The invention claimed is:

1. A system comprising:
an assembly including an electric circuit and a transistor,
wherein the assembly is configured to receive data including a reference parameter of the transistor and a manufacturing tolerance of the reference parameter,
wherein the assembly is characterized by an electric parameter;
wherein an inductance of the electric circuit is selected such that an absolute value of a difference between the electric parameter and the reference parameter is strictly less than the manufacturing tolerance; and
wherein the reference parameter is one selected from the group consisting of a switching characteristic of the transistor, a Miller capacitance of the transistor, a delay time of the transistor, and a rise time of the transistor.

2. The system of claim 1, wherein the inductance is less than 100 nH.

3. The system of claim 1, wherein the inductance is less than 75 nH.

4. The system of claim 1, further including a control circuit configured to drive the transistor.

5. The system of claim 4, wherein the control circuit includes an optical receiver.

6. The system of claim 1, wherein the transistor is an insulated gate bipolar transistor (IGBT).

7. The system of claim 6, wherein the IGBT has a diode disposed between two conducting terminals.

8. The system of claim 1, wherein further including another assembly similarly configured to the assembly.

9. The system of claim 8, wherein the system is configured to simultaneously trigger the assembly and the other assembly.

10. The system of claim 1, wherein the transistor is a power transistor.

* * * * *